United States Patent [19]

Oh

[11] Patent Number: 5,461,587
[45] Date of Patent: Oct. 24, 1995

[54] ROW REDUNDANCY CIRCUIT AND METHOD FOR A SEMICONDUCTOR MEMORY DEVICE WITH A DOUBLE ROW DECODER

[75] Inventor: Seung-Cheol Oh, Suwon, Rep. of Korea

[73] Assignee: Samsung Electronics Co., Ltd., Suwon, Rep. of Korea

[21] Appl. No.: 343,950

[22] Filed: Nov. 17, 1994

[30] Foreign Application Priority Data

Nov. 18, 1993 [KR] Rep. of Korea ............................ 24667

[51] Int. Cl.⁶ .................................................. G11C 7/00
[52] U.S. Cl. ...................... 365/200; 365/225.7; 371/10.3
[58] Field of Search ................................. 365/200, 225.7, 365/230.03; 371/10.1, 10.3

[56] References Cited

U.S. PATENT DOCUMENTS

| | | | |
|---|---|---|---|
| 4,837,747 | 6/1989 | Dosaka et al. ...................... | 365/200 X |
| 4,935,899 | 6/1990 | Morigami .................................. | 365/200 |
| 5,299,164 | 3/1994 | Takeuchi et al. ...................... | 365/201 |
| 5,359,560 | 10/1994 | Suh et al. ................................. | 365/200 |
| 5,377,146 | 12/1994 | Reddy et al. ............................ | 365/200 |

Primary Examiner—David C. Nelms
Assistant Examiner—Son Dinh
Attorney, Agent, or Firm—Charles R. Donohoe; Stephen R. Whitt

[57] ABSTRACT

A row redundancy circuit for use in a semiconductor memory device having one memory cell array, and first and second main row decoders and first and second spare row decoders formed on both sides of the memory cell array includes a first fuse box for receiving addresses and, during the occurrence of a defective address out of the received addresses, cutting a fuse on an input path of the defective address, thereby to supply an output signal to the first spare row decoder, a second fuse box for receiving addresses and, during the occurrence of a defective address out of the received addresses, cutting a fuse on an input path of the defective address, thereby to supply an output signal to the second spare row decoder, and a row redundancy control circuit for receiving the output signals of the first and second fuse boxes and selectively supplying an output signal responsive to the received input signal level to the first and second spare row decoders.

8 Claims, 7 Drawing Sheets

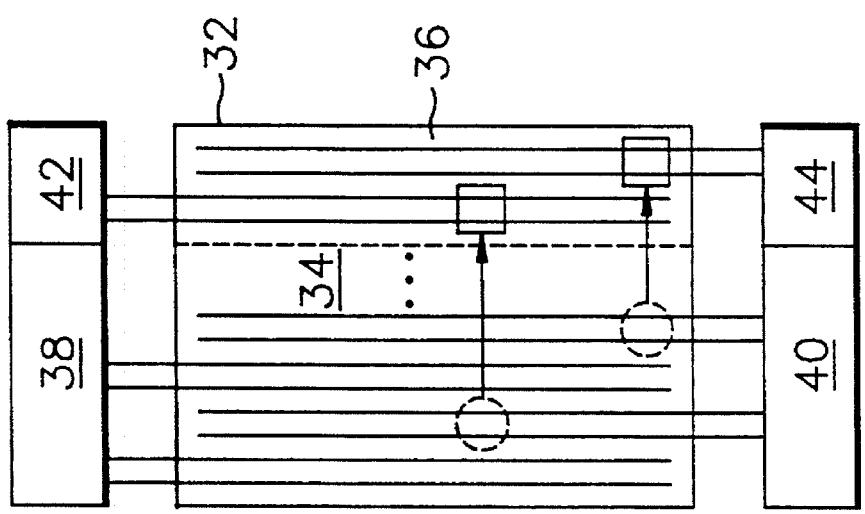
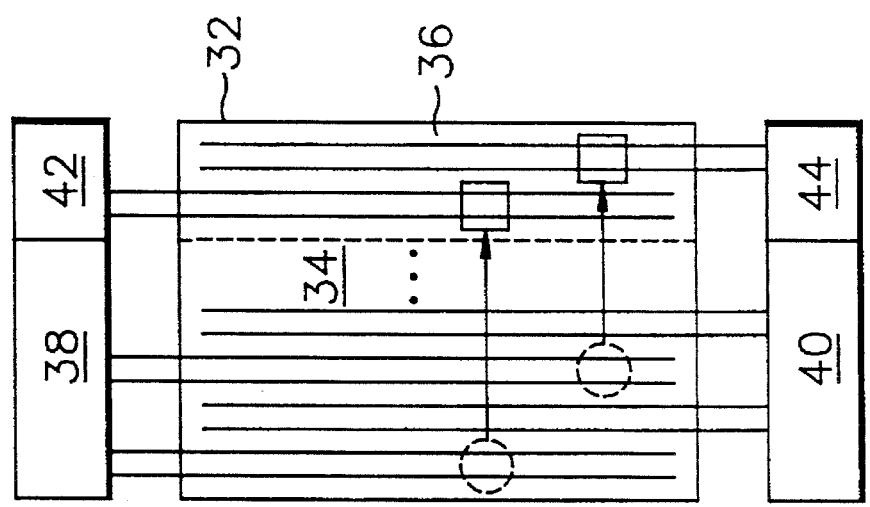
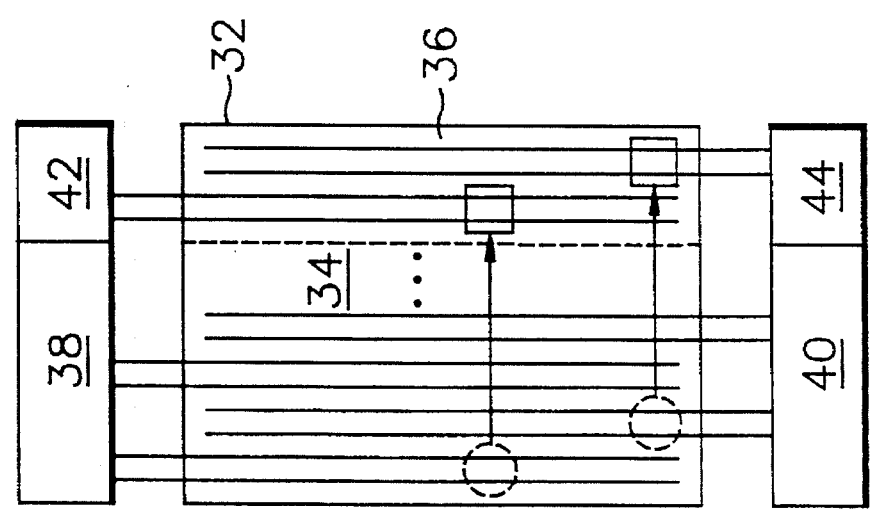

ROW REDUNDANCY CIRCUIT AND METHOD FOR A SEMICONDUCTOR MEMORY DEVICE WITH A DOUBLE ROW DECODER

BACKGROUND OF THE INVENTION

The present invention relates to a semiconductor memory device, and more particularly to a row redundancy circuit and method for a semiconductor memory device having a double row decoder.

A semiconductor memory device such as a dynamic RAM (random access memory) is being developed faster than a memory device such as a static RAM or ROM (read only memory) by about 4 times in an integrated degree. The dynamic RAM of 64 M ($M=2^{20}$) and 256 M-bit order is being developed and the integrated degree will be more increased in the near future. To keep up with the increased integration, the size of each element within a limited chip should be reduced and a line width of each signal shortened. The voltage level of a source voltage also becomes lower. It is very difficult to satisfy these conditions simultaneously in a manufacturing process and problems to be solved take place. As one of important problems, there is a great possibility that defects caused by a memory cell or coupling of a word line may occur. The defects may be increased in proportion to the integrated degree and result in the deterioration of yield. Another problem lies in the arrangement of a row decoder for selecting a memory cell. In the dynamic RAM, one memory cell consists of one storage capacitor and one access transistor. Therefore, the dynamic RAM has a smaller area occupied by one memory cell than other memory devices. There are a plurality of memory cells in the direction of row and column, i.e. in the form of a matrix. These memory cells are selected by a word line, and a plurality of memory cells are connected to one word line in the its length direction. Therefore, one row decoder, i.e. one word line driver, for selecting the word line should be provided to one word line. As the size of the memory cell is reduced, the line width of the word line is shortened, while the area occupied by one word line driver is more increased. Hence, with the increase in the integration of the dynamic RAM, the design problem of the row decoder functions as a very difficult problem in the manufacturing process.

In techniques for forming a double row decoder proposed to overcome the arrangement problem of the row decoder, the row decoder selecting a neighboring word line is not adjacent to another row decoder. Assuming that a first row decoder for selecting a first word line is positioned on the left of one unit memory cell array, a second row decoder for selecting a second word line adjacent to the first word line is formed on the right of the unit memory cell array. This arrangement reduces a word line pitch and increases the area occupied by a transistor constituting a word line driver, thereby improving the integrated degree.

Meanwhile, during the occurrence of defects by the memory cell or the coupling of the word line in the double row decoder techniques, repair efficiency is lowered. The defects on the same chip are mainly owing to a short phenomenon of the word line by the coupling of the word line, and this possibility is more increased as the line width of the word line is minute.

FIG. 1 shows a row redundancy construction illustrating a process for repairing defects in a double row decoder. The construction of FIG. 1 includes a fuse box for repairing defects, and it is well known to those skilled in the art that techniques for repairing defects depending on whether a specific fuse in the fuse box is cut or not by the decoding of an internal address using the fuse box. As indicated in FIG. 1, there are a plurality of memory cell array blocks in a cell array region 30 on the same chip, and a main memory cell array 4A and a spare memory cell array 6A constitute one memory cell array 2A. In this case, it is assumed that a spare row decoder 12A includes spare word lines 26A and 26B, and a pare row decoder 14A includes spare word lines 28A and 28B. That is, it is assumed that each of the spare row decoders 12A and 14A repairs the defects of two main word lines selected by each of main row decoders 8A and 10A. Assuming that word lines 20A and 20B connected to the main row decoder 8A short from each other, to generate a defect, a specific fuse in a fuse box 16A is cut through the decoding of the internal address, to repair or replace the defective main word lines 20A and 20B with the spare word lines 26A and 26B connected to the spare row decoder 12A. If main word lines 22A and 22B connected to the main row decoder 10A short from each other, the defect is replaced or repaired with the spare word lines 28A and 28B connected to the spare row decoder 14A, by cutting a specific fuse in a fuse box 18A through the decoding of the internal address. By so doing, the defective main word lines connected to the main row decoder 8A are repaired by the spare word lines connected to the spare row decoder 12A, and the defective main word lines connected to the main row decoder 10A are repaired by the spare word lines connected to the spare row decoder 14A, through the decoding of the internal address. Such a process is applied to other memory cell array blocks. However, if the main word lines 20A and 20B connected to the main row decoder 8A, and main word lines 24A and 24B short from each other, only one pair of defective word lines is repaired by the spare word lines 26A and 26B, and the other pair of defective word lines can not be repaired. In other words, in a conventional semiconductor memory device using a double row decoder, if the defects of the main word line selected by the main row decoder 8A (or 10A) occur over the number of spare word lines capable being replaced in the spare row decoder 12A (or 14A), the defect of the corresponding main word line can be repaired even if the number of the spare word lines of the other spare row decoder 14A (or 12A) exists sufficiently. If the defect of any one of numerous word lines on the same chip is not repaired, a manufacturing company suffers a considerable loss since the same chip itself can not be used. Further, since the repair efficiency is lowered, the yield is reduced and the reliability for the chip deteriorates.

SUMMARY OF THE INVENTION

It is an object of the invention to provide a row redundancy circuit for increasing the yield of a chip by improving repair efficiency in a semiconductor memory device using a double row decoder.

It is another object of the invention to provide a row redundancy circuit for ensuring the reliability for a chip by improving repair efficiency in a semiconductor memory device using a double row decoder.

It is yet another object of the invention to provide a row redundancy method for increasing the yield of a chip by improving repair efficiency in a semiconductor memory device using a double row decoder.

It is still another object of the invention to provide a row redundancy circuit for ensuring the reliability for a chip by improving repair efficiency in a semiconductor memory device using a double row decoder.

It is a further object of the invention to provide a row redundancy circuit for easily repairing defects of two or more defective main word lines by replacing the defective main word lines connected to a specific main row decoder with a spare word line connected to a spare row decoder disposed on the other side thereof in a semiconductor memory device using a double row decoder.

It is a still further object of the invention to provide a row redundancy method for easily repairing defects of two or more defective main word lines by replacing the defective main word lines connected to a specific main row decoder with a spare word line connected to a spare row decoder disposed on the other side thereof in a semiconductor memory device using a double row decoder.

These and other objects may be achieved with a semiconductor memory device including main row decoders positioned on both sides of a specific memory cell array, for selecting a word line formed on the specific memory cell array.

The semiconductor memory device according to the present invention has a row redundancy circuit for flexibly repairing defects irrespective of a defective specific word line out of main word lines connected to first and second row decoders positioned on both sides of one memory cell array.

In accordance with one aspect of the invention, a row redundancy circuit for use in a semiconductor memory device having one memory cell array, and first and second main row decoders and first and second spare row decoders formed on both sides of the memory cell array includes a first fuse box for receiving addresses and, during the occurrence of a defective address out of the received addresses, cutting a fuse on an input path of the defective address, thereby to supply an output signal to the first spare row decoder, a second fuse box for receiving addresses and, during the occurrence of a defective address out of the received addresses, cutting a fuse on an input path of the defective address, thereby to supply an output signal to the second spare row decoder, and a row redundancy control circuit for receiving the output signals of the first and second fuse boxes and selectively supplying an output signal responsive to the received input signal level to the first and second spare row decoders.

In accordance with another aspect of the invention, a row redundancy method of a semiconductor memory device having one memory cell array, and first and second main row decoders and first and second spare row decoders formed on both sides of the memory cell array includes the steps of receiving addresses through a first fuse box and, during the occurrence of a defective address out of the received addresses, cutting a fuse on an input path of the defective address within the first fuse box, thereby to supply an output signal to the first spare row decoder; receiving addresses through a second fuse box and, during the occurrence of a defective address out of the received addresses, cutting a fuse on an input path of the defective address within the second fuse box, thereby to supply an output signal to the second spare row decoder; and receiving the output signals of the first and second fuse boxes through a row redundancy control circuit and selectively supplying an output signal of the row redundancy control circuit to the first and second spare row decoders in response to the received input signal level.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIGS. 10A, 10B and 10C are schematic diagrams showing the effect of a defect repairing process in accordance with the construction of FIG. 2.

DETAILED DESCRIPTION OF THE PREFERRED EMBODIMENT

In the following description, numerous specific details such as a main row decoder, spare row decoder, word line boosting signal generating circuit, fuse box, etc. are set forth to provide a more thorough understanding of the invention. It will be apparent, however, to skilled in the art, that the invention may be practiced without these specific details.

A main memory cell array is referred to, in this field, as a normal memory cell array and they are the same in meaning. Herein the term "main memory cell array" will be used. The term "spare" should be understood as "subsidiary" in meaning.

Figure 1:
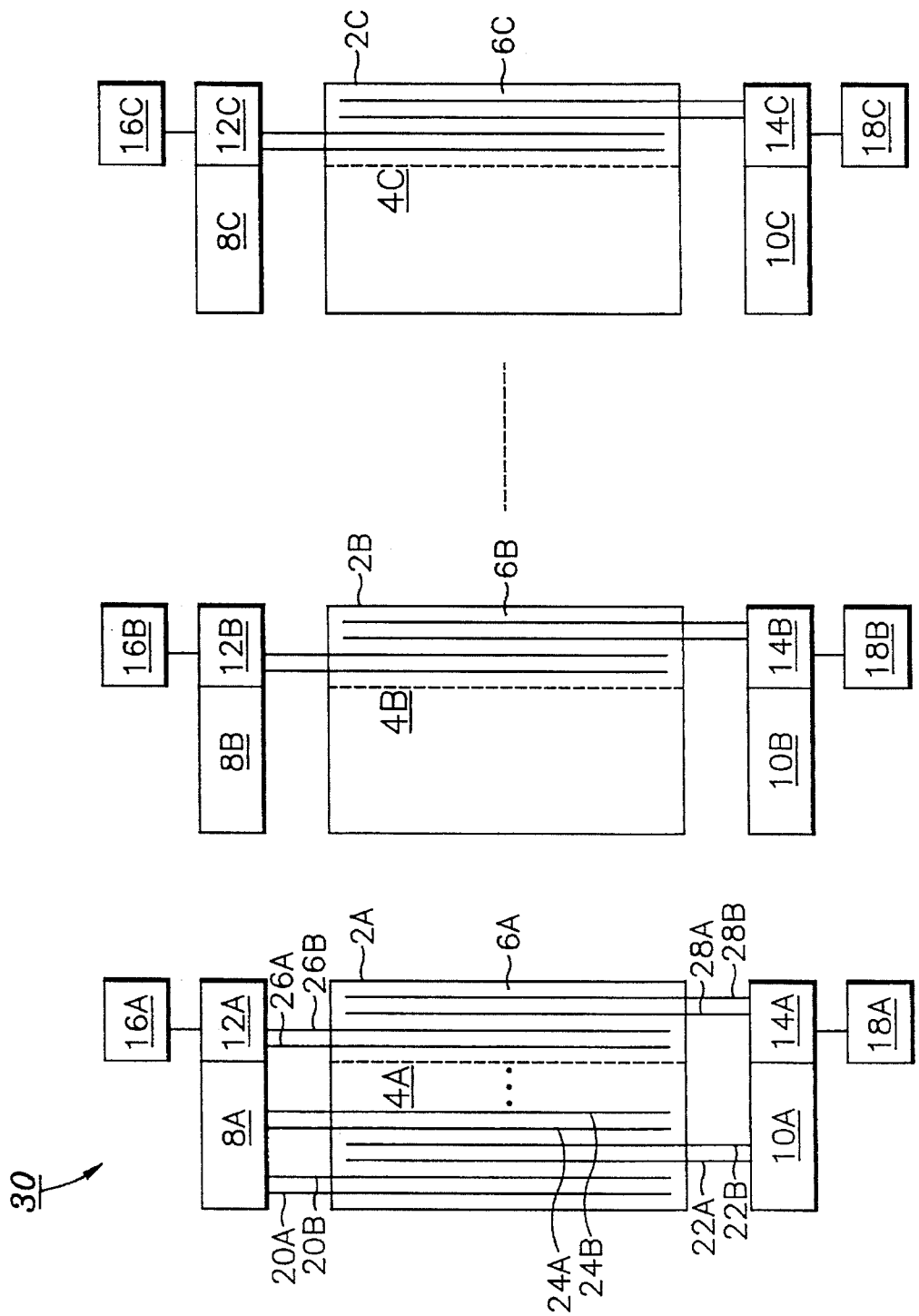
FIG. 1 is a schematic diagram of a row redundancy construction illustrating a process for repairing defects in a double row decoder according to a prior art.
Figure 2:
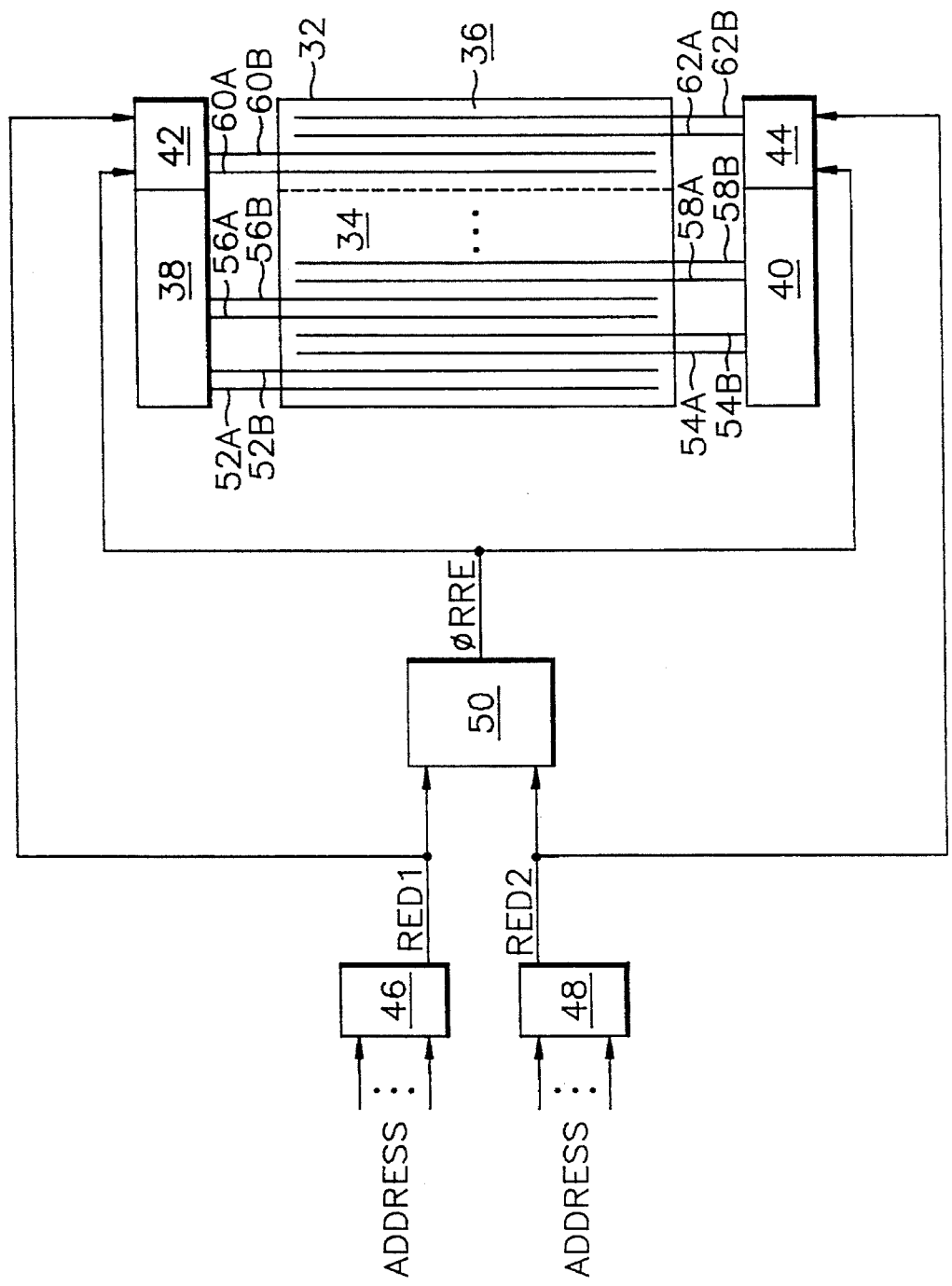
FIG. 2 is a schematic diagram illustrating a functional block construction constituting a row redundancy circuit, as a process for repairing defects in a double row decoder according to the present invention.

FIG. 2 shows a functional block construction constituting a row redundancy circuit, as a process for repairing defects in a double row decoder. The construction of FIG. 2 shows one of a plurality of memory cell array blocks on the same chip. As there are a plurality of memory cell array blocks in the direction of row and column, various modifications are possible. The number of word lines on a main memory cell array 34 may be increased in proportion to the integrated degree. One memory cell array block 32 includes the main memory cell array 34 and a spare memory cell array 36 which are formed within the same region. A first main row decoder 38 supplies to the main memory cell array 34 main word lines from a first direction. A second main row decoder 40 supplies to the main memory cell array 34 main word lines from a second direction opposite to the first direction to be interleaved with the main word lines connected to the first main row decoder 38. A first spare row decoder 42 supplies a pair of spare word lines to the spare memory cell array 36 from the first direction. A second spare row decoder 44 supplies a pair of spare word lines to the spare memory cell array 36 from the second direction. A first fuse box 46 receives addresses and, during the occurrence of a defective address out of the received addresses, cuts a fuse on an input path of the defective address, thereby to supply a resultant signal RED1 to the first spare row decoder 42. A second fuse box 48 receives addresses and, during the occurrence of a defective address out of the received addresses, cuts a fuse on an input path of the defective address, thereby to supply a resultant signal RED2 to the second spare row decoder 44. A row redundancy control circuit 50 receives the output signals RED1 and RED2 of the first and second fuse boxes 46 and 48 and supplies an output signal responsive to the received input signal level to the first and second spare row decoders 42 and 44.

The row redundancy control circuit 50 controls the first and second spare row decoders 42 and 44 in response to the combination input of the output signals RED1 and RED2 of the first and second fuse boxes 46 and 48 so as to repair defects during the occurrence of a defective specific main word line irrespective of the position of the defective main word line. For example, if a main word line 52A and/or 52B generated from the first main row decoder 38 have/has defects, the defective main word line can be repaired with spare word lines 62A and 62B generated from the second spare row decoder 44 by the output signal φRRE of the row redundancy control circuit 50 corresponding to fuse cutting information of the first fuse box 46 and/or second fuse box 48. This repairing process is carded out in the same way when a main word line 54A and/or 54B generated from the second main row decoder 40 have/has defects. That is, the defective main word line can be repaired by spare word lines 60A and 60B produced from the first spare row decoder 42 by the output signal φRRE of the row redundancy control circuit 50 corresponding to the fuse cutting information of the first fuse box 46 and/or second fuse box 48. A detailed description of a defect repairing process will be described later on.

Figure 3:
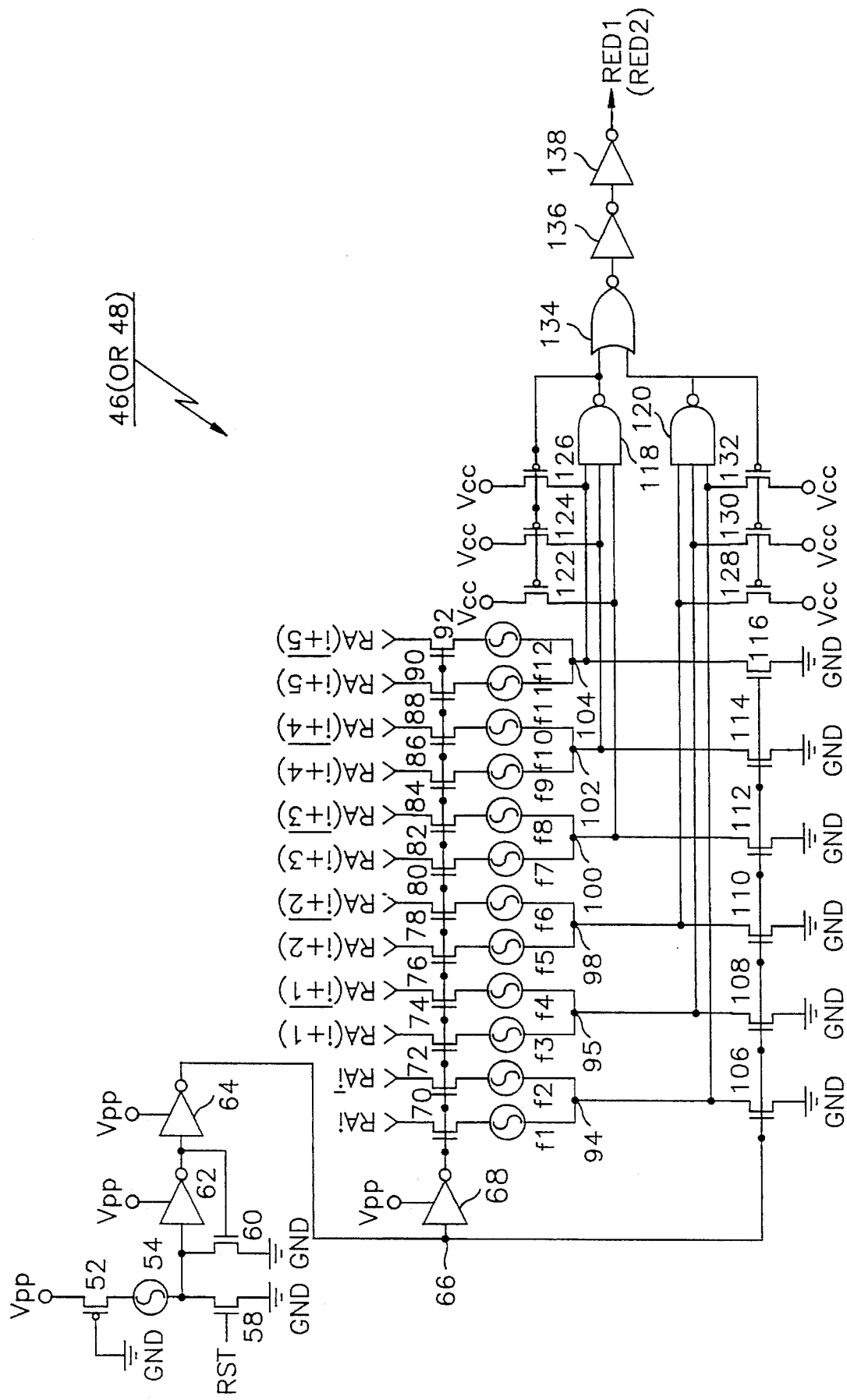
FIG. 3 is a circuit diagram of a fuse box 46 or 48 of FIG. 2.

FIG. 3 is a circuit diagram of the fuse box 46 or 48 of FIG. 2. For descriptive convenience, although 6 row addresses RAi, RA(i+1), RA(i+2), RA(i+3), RA(i+4) and RA(i+5) are supplied, the number of row addresses capable of selecting all the main word lines 52A, 52B, 54A, 54B, 56A, 56B, 58A, 58B, . . . , included in one main memory cell array 34 of FIG. 2 should be applied. All the main word lines in the main memory cell array 34 can be selected by the row addresses RAi, $\overline{RAi}$, RA(i+1), $\overline{RA(i+1)}$, RA(i+2), $\overline{RA(i+2)}$, RA(i+3), $\overline{RA(i+3)}$, RA(i+4), $\overline{RA(i+4)}$, RA(i+5), $\overline{RA(i+5)}$ supplied to the fuse box 46 or 48 of FIG. 3 and by the combination of theses row addresses. Elements 52 to 64 constitute a circuit for enabling the operation of the fuse box of FIG. 3. A reset signal RST enables a redundancy operation. If there take place defects, the redundancy operation is enabled by the enabling operation of the reset signal RST and the cutting operation of a master fuse 54. Each channel of transfer gates 70, 72, . . . , 92 is formed on each path to which the row addresses RAi, $\overline{RAi}$, RA(i+1), $\overline{RA(i+1)}$, RA(i+2), $\overline{RA(i+2)}$, RA(i+3), $\overline{(i+3)}$, RA(i+4), $\overline{RA(i+4)}$, RA(i+5), $\overline{RA(i+5)}$ are applied. The sources of the transfer gates 70, 72, . . . , 92 are respectively connected to fuses f1, f2, . . . , f12. Whether or not the fuse is cut is determined by defect address information. If the row address RAi is a detective address, the fuse f2 on the path to which the row address $\overline{RAi}$ is applied is cut, as is well known to those skilled in the art. The defective address RAi is supplied to a NOR gate 134 through a NAND gate 120 to generate the redundancy information RED1 or RED2. It should be noted that the row addresses by the number capable of selecting all the word lines in the main memory cell array 34 of FIG. 2 are applied. Other circuits are well known and will therefore not be described in detail herein. Referring back to FIG. 2, the spare word lines are produced from one spare row decoder 42 or 44 in pairs. In the fuse box of FIG. 3, there is no need to supply the row address for selecting only one main word line since most of the defects are caused by the coupling of the main word lines adjacent to each other. That is, only row addresses for selecting a pair of word lines are needed.

Figure 4:
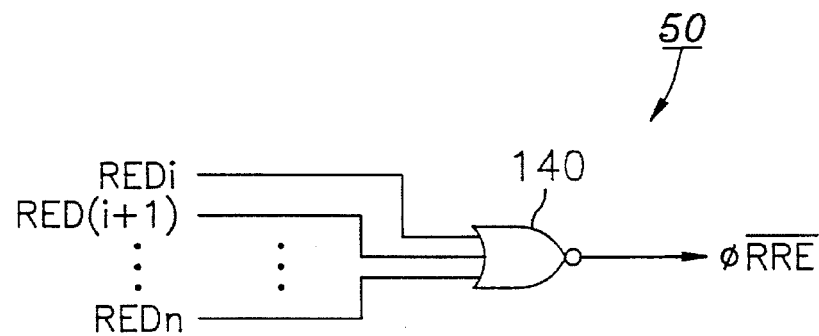
FIG. 4 is a circuit diagram of a row redundancy control circuit 50 of FIG. 2.

FIG. 4 is a circuit diagram of the row redundancy control circuit 50 of FIG. 2. A row redundancy enable signal φRRE is enabled by the NOR gate 140 receiving output signals REDi, RED(i+1), . . . REDn (where i=1, 2, . . . , n) of a plurality of fuse boxes are applied to a NOR gate 140 and generating a negative logic sum of input signals. The signal $\overline{\phi RRE}$ is converted into φRRE through an inverter (FIG. 7) to be supplied to the first and second spare row decoder 42 and 44 of FIG. 2. Referring again to FIG. 2, the construction of FIG. 4 is achieved by 2-input NOR gate receiving the output signals RED1 and RED2 of the fuse boxes.

Figure 5:
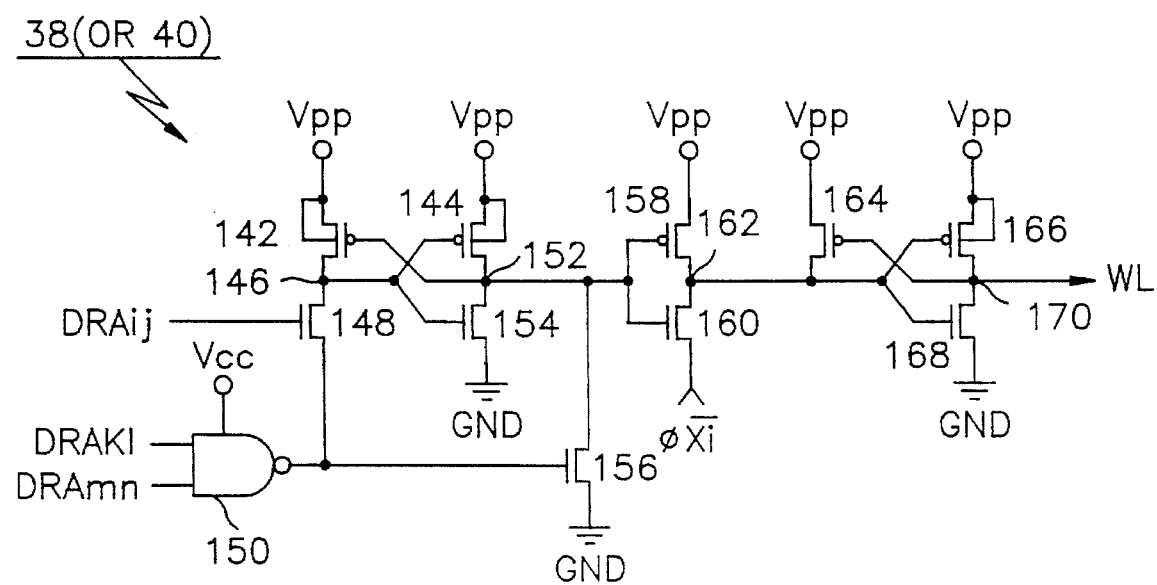
FIG. 5 is a circuit diagram of a main row decoder 38 or 40 of FIG. 2.

FIG. 5 is a circuit diagram of the main row decoder 38 or 40 of FIG. 2. The main row decoder 38 or 40 selects a specific main word line WL by the combination input of decoded row addresses DRAij, DRAKl and DRAmn and is well known in the art. For the detailed construction and operation, refer to Korea patent NO. 93-1514, entitled "WORD LINE DRIVING CIRCUIT OF A SEMICONDUCTOR MEMORY DEVICE", filed 11, Aug. 1993, assigned to the same assignee as the present invention. The main row decoder shown in FIG. 5 is positioned on both sides of the main memory cell array 34 of FIG. 2, thereby forming a double row decoder.

Figure 6:
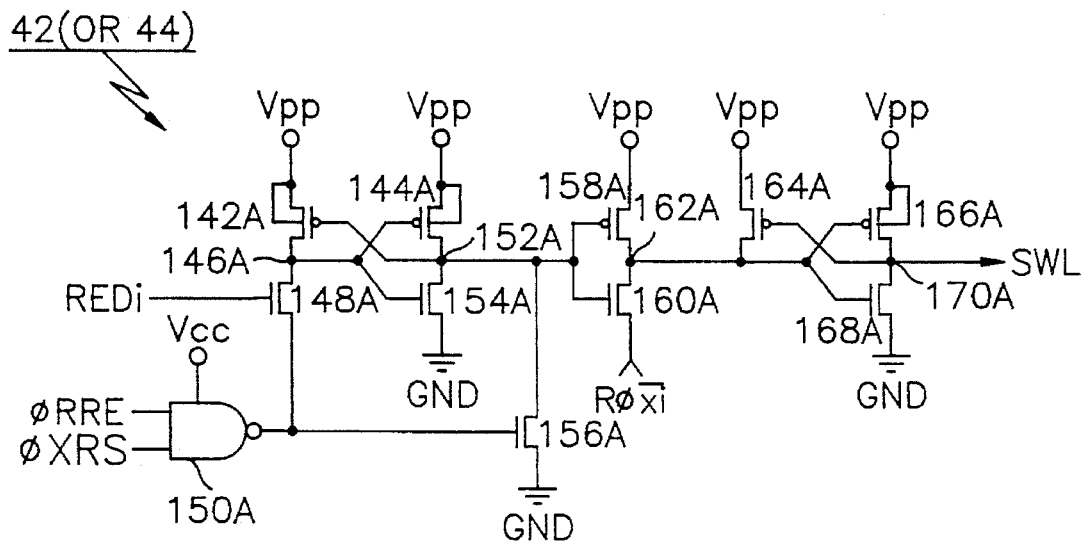
FIG. 6 is a circuit diagram of a spare row decoder 42 or 44 of FIG. 2.

FIG. 6 is a circuit diagram of the spare row decoder 42 or 44 of FIG. 2. The circuit of FIG. 6 is the same as that of FIG. 5 except input signals. The input signal REDi is generated from the fuse box of FIG. 3, φRRE is generated from the row redundancy control circuit 174 of FIG. 7, and φXRS is for resetting a spare word line SWL. A spare word line boosting signal Rφ$\overline{Xi}$ is for supplying a voltage to the spare word line SWL.

Figure 7:
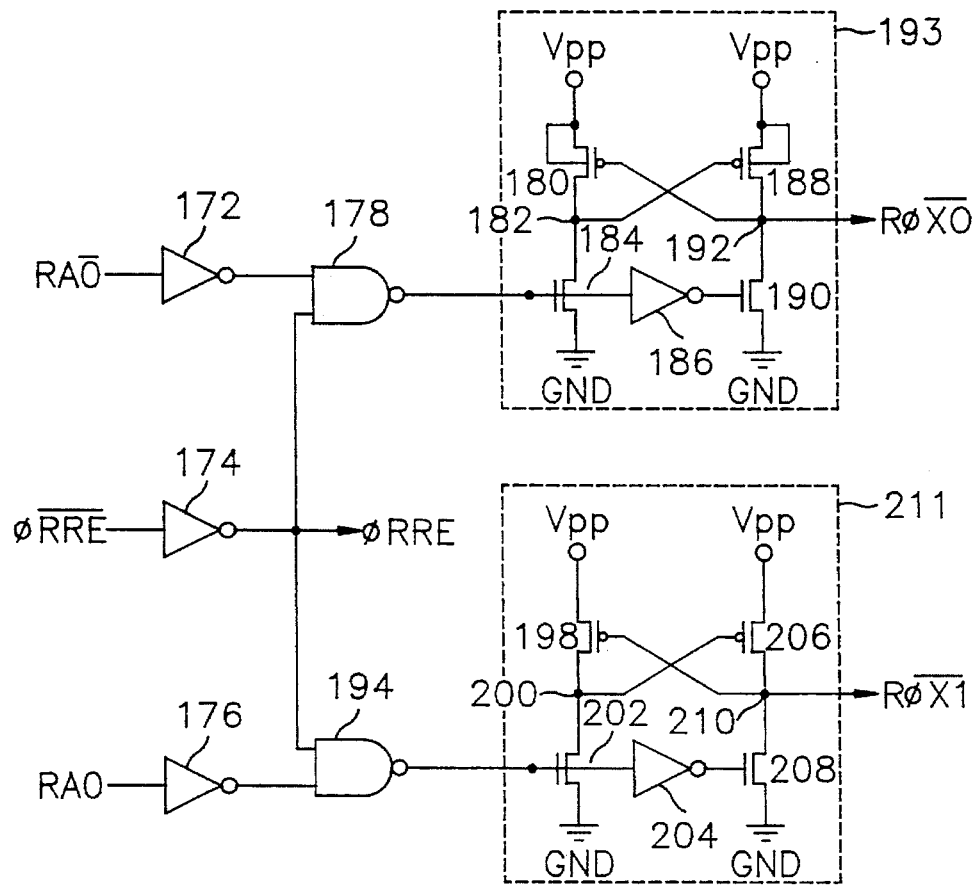
FIG. 7 illustrates a circuit for generating a spare word line boosting signal $R_\phi \overline{X}i$ used in the spare row decoder of FIG. 6.

FIG. 7 shows a circuit for generating the spare word line boosting signal Rφ$\overline{Xi}$ used in the spare row decoder of FIG. 6. The circuit of FIG. 7 is constructed by the combination of a row addresses RA0 and $\overline{RA0}$ of a least significant bit (LSB), and the row redundancy enable signal $\overline{\phi RRE}$ of the row redundancy control circuit. The signal $\overline{\phi RRE}$ of the row redundancy control circuit is converted into the signal φRRE through an inverter 174. The row address RA0 and the signal φRRE are supplied to a NAND gate 178 and a first level converting circuit 193 generates a first spare word line boosting signal Rφ$\overline{X0}$ in response to the output signal of the NAND gate 178. The row address $\overline{RA0}$ and the signal φRRE are supplied to a NAND gate 194 and a second level converting circuit 211 generates a second spare word line boosting signal Rφ$\overline{Xi}$ in response to the output signal of the NAND gate 194. The first and second word line boosting signals Rφ$\overline{X0}$ and Rφ$\overline{Xi}$ generated from the first and second level converting circuit 193 and 211 are supplied to the first and second spare row decoders 42 and 44 of FIG. 2, respectively.

Figure 8:
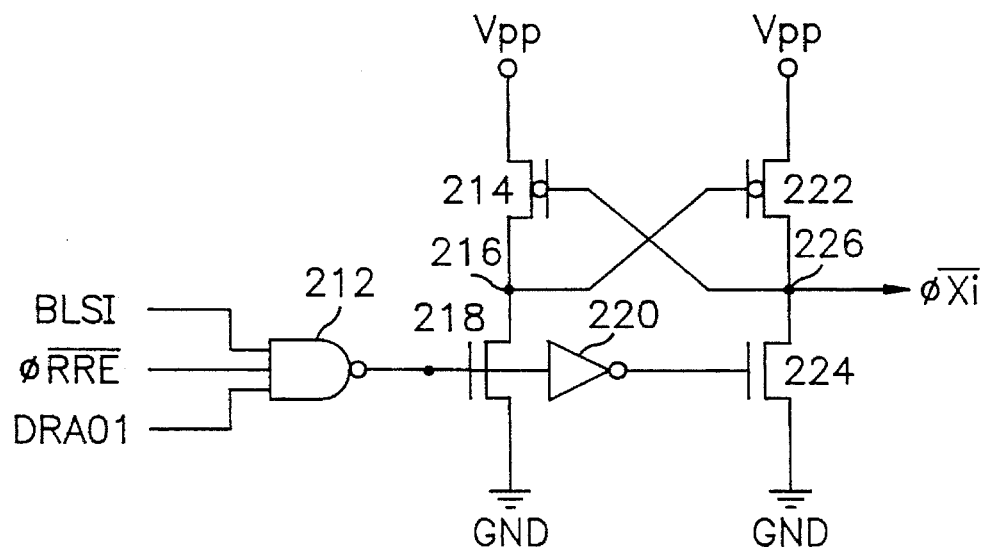
FIG. 8 illustrates a circuit for generating a main word line boosting signal $\phi \overline{X}i$ used in the main row decoder of FIG. 5.

FIG. 8 shows a circuit for generating a main word line boosting signal $\phi\overline{Xi}$ used in the main row decoder of FIG. 5. The circuit of FIG. 8 is achieved using a construction such as a first or second level converting circuit 193 or 211 and driven by the NAND combination of a block select signal BLSI for selecting a specific memory cell array block, row redundancy enable signal $\phi\overline{RRE}$ and decoded row address DRA01. The main word line boosting signal $\phi\overline{Xi}$ is supplied to the first or second main row decoder 38 or 40 of FIG. 5.

Figure 9:
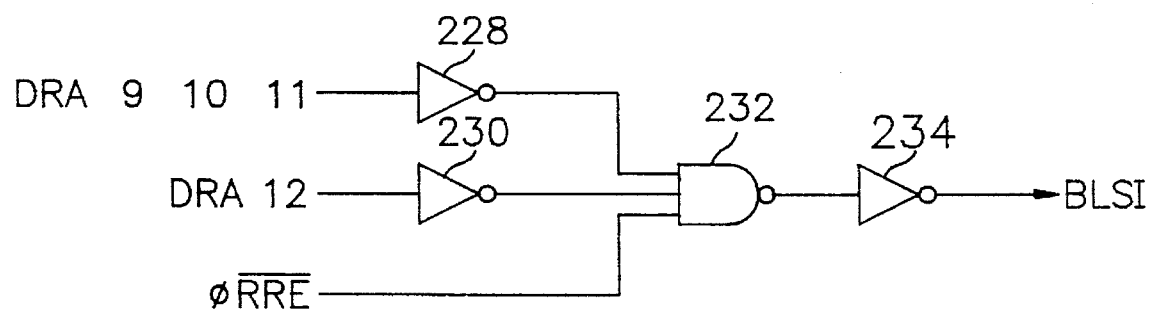
FIG. 9 illustrates a circuit for generating a block select signal BLSI supplied to the circuit of FIG. 8 as input signal.

FIG. 9 is a circuit for generating the block select signal BLSI supplied to the circuit of FIG. 8 as an input signal. Decoded row addresses DRA9, DRA10, DRA11 and DRA12 are supplied as input signals of the circuit of FIG. 9 since addresses A9, A10 and A11 out of the row addresses supplied from a system select a specific memory cell array block. If the external addresses for selecting the specific memory cell array block are A 11, A 12, A 13 and A 14, the decoded row addresses DRA11, DRA12, DRA13 and DRA14 should be supplied. The row redundancy enable signal $\phi$RRE supplied as an input signal disables the output of a NAND gate 232 in order to repair defects irrespective of a defective specific block during a defect repairing operation.

A process for repairing defects in accordance with the block construction of FIG. 2 will now be described with reference to FIGS. 3 to 9. Since the row address which can discriminate a different main row decoder is supplied from the first and second fuse boxes 46 and 48, the first and second main row decoders 38 and 40 are disabled and only the first or second spare row decoder 42 or 44 is enabled, when the row redundancy is enabled in accordance with a prescribed program operation. If a defective main word line or a pair of defective main word lines is detected within the main memory cell array 34 of FIG. 2, the fuse box of FIG. 3 cuts a corresponding fuse in consideration of the address responsive to this main word line or pair of word lines. Under a state so programmed, if the row address for selecting the defective main word line or pair of defective main word line is applied, the signal RED1 or RED2 is enabled from the fuse box of FIG. 3 and supplied to the first or second spare row decoder 42 or 44. The signal RED1 or RED2 becomes a stand-by state at the first or second spare row decoder 42 or 44. The row redundancy control signal 50 is enabled by the signal RED1 or RED2 and the row redundancy enable signal $\phi$RRE is enabled, thereby disabling the block select signal generating circuit of FIG. 9. If the block select signal BLSI is disabled, the main word line boosting signal generating circuit of FIG. 8 is disabled. Then all the main word line boosting signals $\phi\overline{Xi}$ supplied to the main row decoder 38 or 40 of FIG. 2 are disabled, and the operation for selecting the main word line is disabled. Referring back to FIG. 7, the first or second spare word line boosting signal $R_\phi\overline{X0}$ or $R_\phi\overline{X1}$ is generated by the combination of the row redundancy enable signal $\phi$RRE and the row address RA0 or $\overline{RA0}$. It should be noted that the first or second spare word line boosting signal $R_\phi\overline{X0}$ or $R_\phi\overline{X1}$ is generated regardless of the position of the main row decoder in which a specific main word line is contained. Meanwhile, if the first or second spare word line boosting signal $R_\phi\overline{X0}$ or $R_\phi\overline{X1}$ is supplied to the first or second spare row decoder 42 or 44 of FIG. 6, a specific spare word line is enabled by the combination of the signal RED1 or RED2 in a stand-by state and the spare word line boosting signal $R_\phi\overline{X0}$ or $R_\phi X1$. Therefore, the defective main word line is repaired. By such a defect repairing process, since the fuse box and spare row decode are separated from the main row decoder, the efficiency of the row redundancy is improved and the yield is increased.

FIGS. 10A, 10B and 10C show the effect of a defect repairing process in accordance with the construction of FIG. 2. FIG. 10A shows a typical defect repairing process in a double row decoder and the present invention is also applicable. FIG. 10B shows defects generated only on main word lines or a pair of main word lines connected to the first main row decoder 38. These defects can be easily repaired by the spare word lines included in the spare memory cell array 36. FIG. 10C shows defects generated only on main word lines or a pair of main word lines connected to the second main row decoder 40. The defects can be also repaired by the spare word lines included in the spare memory cell array 36.

As described above, the row redundancy circuit for use in a semiconductor memory device having a double row decoder can flexibly repair a defective specific main word line by use of another spare row decoder as well as a corresponding spare row decoder. Therefore, the efficiency of row redundancy is improved and the yield is increased.

The foregoing description shows only a preferred embodiment of the present invention. Various modifications are apparent to those skilled in the art without departing from the scope of the present invention.

What is claimed is:

1. A row redundancy circuit for use in a semiconductor memory device having one memory cell array, first and second main row decoders formed on both sides of said memory cell array, and first and second spare row decoders formed on both sides of said memory cell array, said row redundancy circuit comprising:

a first fuse box for receiving addresses and, during the occurrence of a defective address out of the received addresses, cutting a fuse on an input path of said defective address, thereby to supply an output signal to said first spare row decoder;

a second fuse box for receiving addresses and, during the occurrence of a defective address out of the received addresses, cutting a fuse on an input path of said defective address, thereby to supply an output signal to said second spare row decoder; and a row redundancy control circuit for receiving the output signals of said first and second fuse boxes and selectively supplying an output signal responsive to the output signals of the first and second fuse boxes to said first and second spare row decoders.

2. The row redundancy circuit as set forth in claim 1, wherein a defective word line generated from said first main row decoder is repaired through said second fuse box and said second spare row decoder.

3. The row redundancy circuit as set forth in claim 1, wherein a defective word line generated from said second main row decoder is repaired through said first fuse box and said first spare row decoder.

4. The row redundancy circuit as set forth in claim 1, wherein said row redundancy control circuit is of a NOR gate receiving the output signals of said first and second fuse boxes.

5. A row redundancy method of a semiconductor memory device having one memory cell array, first and second main row decoders formed on both sides of said memory cell array, and first and second spare row decoders formed on both sides of said memory cell array, said row redundancy method comprising the steps of:

receiving addresses through a first fuse box and, during the occurrence of a defective address out of the received addresses, cutting a fuse on an input path of said defective address within said first fuse box, thereby to supply an output signal to said first spare row decoder;

receiving addresses through a second fuse box and, during the occurrence of a defective address out of the received addresses, cutting a fuse on an input path of said defective address within said second fuse box, thereby to supply an output signal to said second spare row decoder; and receiving the output signals of said first and second fuse boxes through a row redundancy control circuit and selectively supplying an output signal of said row redundancy control circuit to said first and second spare row decoders in response to the output signals of the first and second fuses boxes.

6. The row redundancy method as set forth in claim 5, further comprising the step of repairing a defective word line generated from said first main row decoder through said second fuse box and said second spare row decoder.

7. The row redundancy method as set forth in claim 5, further comprising the step of repairing a defective word line generated from said second main row decoder through said first fuse box and said first spare row decoder.

8. The row redundancy method as set forth in claim 5, wherein said row redundancy control circuit is of a NOR gate receiving the output signals of said first and second fuse boxes.

* * * * *